United States Patent [19]

Yasui et al.

[11] 4,291,148

[45] Sep. 22, 1981

[54] PROCESS FOR PREPARATION OF A PHENOLIC-POLYBUTADIENE-HCHO RESIN COMPOSITION USEFUL FOR LAMINATED SHEET

[75] Inventors: Seimei Yasui, Takarazuka; Masakazu Sagou; Takanobu Noguchi, both of Osaka; Yoshiki Toyoshima; Junzo Saito, both of Niihama, all of Japan

[73] Assignee: Sumitomo Chemical Company, Limited, Osaka, Japan

[21] Appl. No.: 47,946

[22] Filed: Jun. 12, 1979

[30] Foreign Application Priority Data

Mar. 2, 1979 [JP] Japan .................................. 54-24823

[51] Int. Cl.$^2$ ........................... C08G 8/12; C08G 8/30
[52] U.S. Cl. ............................... 528/142; 260/32.8 R; 260/33.2 R; 260/33.4 R; 260/33.6 R; 260/33.8 R; 428/436; 428/443; 428/460; 428/524; 428/531; 528/145; 528/146; 528/152; 528/159
[58] Field of Search ............... 528/146, 152, 159, 142, 528/145, 137

[56] References Cited

U.S. PATENT DOCUMENTS

| | | | |
|---|---|---|---|
| 2,465,299 | 3/1949 | Wachter | 528/146 X |
| 2,631,140 | 3/1953 | Bloch | 528/146 |
| 2,827,946 | 3/1958 | Christenson et al. | 528/152 X |
| 2,843,565 | 7/1958 | Christenson et al. | 528/152 |
| 2,843,566 | 7/1958 | Christenson et al. | 528/152 |
| 2,948,702 | 8/1960 | Vogel et al. | 528/152 X |

FOREIGN PATENT DOCUMENTS

| | | |
|---|---|---|
| 2310743 | 9/1974 | Fed. Rep. of Germany ...... 528/152 |
| 47-43312 | 11/1972 | Japan . |
| 48-79895 | 10/1973 | Japan . |
| 50-109285 | 8/1975 | Japan . |

OTHER PUBLICATIONS

Chem. Abstracts, vol. 83, 1975, 206986y, Dear et al.

Primary Examiner—Howard E. Schain
Attorney, Agent, or Firm—Birch, Stewart, Kolasch and Birch

[57] ABSTRACT

Process for the preparation of a phenol resin modified with a liquid polybutadiene which comprises reacting a polybutadiene having a number average molecular weight of 150 to 5,000 with a phenol in the presence of an acid catalyst to obtain a composition which consists of a polybutadiene-phenol adduct and unreacted phenol, in said polybutadiene-phenol adduct, one molecule of phenol per 3 to 8 butadiene units being added to the polybutadiene, and reacting the composition of a polybutadiene-phenol adduct with a formaldehyde in the presence of a basic catalyst, said basic catalyst comprising a primary amine of the formula: R—NH$_2$ wherein R is a hydrocarbon group having 1 to 20 carbon atoms in an amount of 0.01 to 0.5 mole per 1 mole of the phenol used for the preparation of the composition which is used alone or in combination thereof with other basic compound. Said resin composition thus prepared is useful for the preparation of a laminated sheet having excellent curing characteristics, particularly excellent electrical characteristics, punchability and flexibility.

9 Claims, No Drawings

PROCESS FOR PREPARATION OF A PHENOLIC-POLYBUTADIENE-HCHO RESIN COMPOSITION USEFUL FOR LAMINATED SHEET

The present invention relates to a process for the preparation of a novel resin composition comprising a phenol resin modified with a liquid polybutadiene, which is useful as a bonding agent for laminated sheets. More particularly, it relates to a process for the preparation of a resin composition which comprises subjecting a phenol to an addition reaction with a liquid polybutadiene having a number average molecular weight of 150 to 5,000 and reacting the resulting resin with formaldehyde in the presence of a basic catalyst selected from a primary amine of the formula: $R-NH_2$ wherein R is a hydrocarbon group having 1 to 20 carbon atoms or a mixture thereof with another basic catalyst, said resin composition comprising a phenol resin modified with a liquid polybutadiene being useful as a bonding agent for laminated sheets, i.e. as a varnish for impregnating into base materials for laminated sheets because of its excellent solubility in an organic solvent. The laminated sheet prepared by using the novel resin composition of the present invention as a bonding agent has excellent machinability, chemical resistance, curing characteristics and has various properties similar to or greater than those of the conventional phenol resins modified with a drying oil, and further, the resin composition of the present invention can be prepared at a low cost.

Phenol resins have excellent properties, such as excellent water resistance, heat resistance and electrical characteristics, but are hard and brittle, and hence, they are not used alone but are usually used in combination with other ingredients.

Laminated sheets are usually prepared by impregnating an uncured phenol resin into a base material such as paper, cotton cloth, asbestos paper, asbestos cloth or glass fiber cloth, drying the base material, and piling up a few or some of the base material thus impregnated with an uncured phenol resin and then pressing with heating the thus piled base materials to form a sheet. The laminated sheets thus prepared are widely used as an electrical insulating material. Particularly, phenolic paper laminated sheets having a thickness of 0.8 to 3.2 mm are widely used for electrical devices, and copper-clad laminates are used for printed-wiring boards. The latter copper-clad laminates are usually required to have excellent punchability at a low temperature, because when wire terminals of parts such as an electrical resistance, diode or condenser means are inserted into punched holes thereof by an automatic insertion machine, an excellent dimension accuracy for punching is required. In order to give the laminate sheet an impact resistance, the laminate sheet is usually modified with a modifying agent such as a vegetable oil, an alkylphenol, or a polyether, by means of which flexibility is given to the laminate sheet. A representative example of the modifying agent is tung oil, but since it is a natural product and is expensive and further the cost is variable, it is very difficult to obtain in a stable cost and amount. Moreover, owing to the molecular structure of the tung oil, a laminated sheet modified with tung oil has inferior electrical characteristics.

With the recent development of electronic devices, and with the progress of compact devices having a high performance, it is required to develop a laminated sheet having improved electrical insulation properties and punchability. Under the circumstances, it has been required to provide a synthetic drying oil which is useful as a modifying agent instead of tung oil.

It is known that a liquid polybutadiene is a representative example of the synthetic drying oil. However, when the liquid polybutadiene is used instead of tung oil, the phenol resin modified with the liquid polybutadiene has a problem that it can not give a homogeneous varnish. A phenolic laminated sheet is generally prepared by dissolving a phenol resin in an organic solvent, impregnating the varnish into a base material to give a prepreg, cutting the prepreg thus obtained in a fixed size, piling up a plural amount of the prepreg and subjecting the piled product to heat-pressing. In this process, when the varnish is not homogeneous, the phenol resin contained in the varnish does not uniformly impregnate into the base material, which results in unfavorable deposition of the resin on the surface of the prepreg and also inferior molding of the laminated sheet. Moreover, the varnish has an inferior storage stability.

As a result of the present inventors' intensive study, it has been found that a phenol resin modified with a liquid polybutadiene having an excellent solubility in an organic solvent (e.g. an alcohol) can be prepared by reacting a phenol resin with a liquid polybutadiene having a number average molecular weight of 150 to 5,000 and reacting the resulting adduct of the phenol resin and the liquid polybutadiene with formaldehyde in the presence of a primary amine as a basic catalyst, and that the phenol resin modified with a liquid polybutadiene thus obtained is useful for the preparation of a laminated sheet having excellent punchability and electrical characteristics.

An object of the present invention is to provide a process for the preparation of a phenol resin modified with a liquid polybutadiene having an excellent solubility in an organic solvent. Another object of the invention is to provide an improved resin composition which has an excellent flexibility and is useful as a bonding agent for laminated sheets. A further object of the invention is to provide a laminated sheet having excellent flexibility, punchability, electrical characteristics, or the like. These and other objects of the invention will be apparent from the following description.

According to the present invention, a liquid polybutadiene having a number average molecular weight of 150 to 5,000 is subjected to an addition reaction with a phenol in the presence of an acid catalyst to obtain a resin composition (A) comprising the addition product and the unreacted phenol, and then reacting the composition (A) thus obtained with formaldehyde in the presence of a primary amine of the formula: $R-NH_2$ wherein R is a hydrocarbon group having 1 to 20 carbon atoms, the addition product of the liqud polybutadiene and the phenol contained in said composition (A) having one molecule of the phenol per 3 to 8 butadiene monomer units.

The liquid polybutadiene used in the present invention has a number average molecular weight of 150 to 5,000, preferably 600 to 2,000, (measured by vapor pressure osmometry), and has preferably a viscosity of 50 to 5,000 cps at 20° C., more preferably 50 to 1,000 cps at 20° C., and an iodine value of 400 iodine/100 g or more. When the liquid polybutadiene has a number average molecular weight of less than 150, the laminated sheet obtained by using the phenol resin modified with the liquid polybutadiene has an inferior chemical resistance and heat resistance, and on the other hand, when the number average molecular weight is over 5,000, the varnish prepared from the phenol resin modified with the liquid polybutadiene is inferior in the impregnation thereof into a base material. The liquid polybutadiene used in the present invention is preferably rich in 1,4-structure, for instance, it has a 1,4-structure of at least 80%. The properties of the phenolic laminated sheet are largely affected by the micro structure and molecular weight of the starting liquid polybutadiene, and when a polybutadiene containing a 1,2-structure of more than 20%, particularly more than 50%, is added to a phenol, a cyclization reaction at the double bonds occurs vigorously by the action of an acid catalyst in addition to the addition reaction with the phenol, and hence, the resin thus obtained shows a higher glass transition point and unfavorably loses its flexibility.

The phenol used in the present invention includes all monovalent or divalent phenols, such as phenol, cresol, xylenol, p-tert-butylphenol, resorcinol, nonylphenol, hydroquinone, catechol, saligenin, or the like, which may be used alone or a combination of two or more thereof.

The composition (A) comprising the addition product of the liquid polybutadiene and the phenol is preferably prepared in the manner that the liquid polybutadiene is wholly or portionwise added to a mixture of an acid catalyst and the phenol, said phenol being used in an amount of 10 to 1,000 parts by weight, preferably 50 to 400 parts by weight, per 100 parts of the liquid polybutadiene. When the amount of phenol is less than 10 parts by weight to 100 parts by weight of the liquid polybutadiene, the processing of a laminated sheet prepared by using the phenol resin modified with a liquid polybutadiene can not sufficiently be done because of the lower curing speed of the phenol resin modified with a liquid polybutadiene, and further, the laminated sheet thus obtained has an inferior chemical resistance. On the other hand, when the amount of phenol is more than 1,000 parts by weight to 100 parts by weight of the liquid polybutadiene, the laminated sheet has unfavorably an inferior punchability at room temperature.

The resin composition (A) preferably contains the addition product of a specific ratio of the liquid polybutadiene and the phenol, i.e. one molecule of the phenol per 3 to 8 units of the butadiene monomer composing the liquid polybutadiene. For instance, in case of a liquid polybutadiene having a number average molecular weight of 1,200, it is preferable to add 2.8 to 7.4 molecules of the phenol per one molecule of the liquid polybutadiene. When the addition molecule number of the phenol is less than one moleucle per 8 units of the butadiene monomer of the liquid polybutadiene, the resol product gives an uneven cured product consisting of two phases of uncured liquid polybutadiene-phenol adduct and solid phenol resin (which is produced by curing of the methylol phenol) or a wholly uncured rubber-like product by curing at 160° C. for 20 minutes. Accordingly, when a laminated sheet is produced by using such a resin composition, the curing speed is very low and hence the processing of the sheet is very difficult. On the other hand, when the addition molecular number of the phenol is over one molecule per 3 units of the butadiene monomer of the liquid polybutadiene, the composition (A) has a very high viscosity, which results in an inferior workability and less impregnating properties into the base material and also inferior punchability of the laminated sheet.

The acid catalyst used in the addition reaction includes protonic acids and Lewis acids. Suitable examples of the protonic acids are mineral acids such as sulfuric acid, hydrochloric acid, or the like, sulfonic acids such as p-toluenesulfonic acid or the like, or a mixture thereof, and suitable examples of Lewis acids are various Lewis acids or a complex thereof, such as aluminum chloride, ferric chloride, boron trifluoride, boron trifluoride-phenol complex, or mixtures thereof. The amount of the acid catalyst is not critical, but it is usually used in an amount of 0.01 to 10 parts by weight per 100 parts by weight of the liquid polybutadiene.

The addition reaction of the liquid polybutadiene and the phenol may optionally be carried out in the presence of a solvent. The solvent has preferably a dielectric constant of not higher than 15, more preferably not higher than 10, at 25° C. Suitable examples of the solvent are hydrocarbons such as benzene, toluene, xylene, n-heptane, n-hexane or cyclohexane; halogenated hydrocarbons such as monochlorobenzene, or dichlorobenzene, or the like. The solvent is preferably used in an amount of 5 to 500 parts by weight, more preferably 10 to 100 parts by weight, per 100 parts by weight of the liquid polybutadiene.

The reaction temperature of the addition reaction is not critical, but is preferably in the range of 40° to 170° C.

The formaldehyde to be reacted with the composition (A) includes formalin and paraformaldehyde. The formaldehyde is used in an amount of 0.6 to 2.0 mole, preferably 0.6 to 2.0 mole, (in case of paraformaldehyde, it is converted into formaldehyde) per 1 mole of the phenol used for the preparation of the composition (A). When the formaldehyde is used in an amount of less than 0.6 mole, the methylol group-introducing reaction can not sufficiently be effected, and hence, the laminated sheet prepared by using such a resin composition has inferior characteristics, i.e. inferior curing characteristics and inferior solvent resistance. On the other hand, when the solvent is used in an amount of more than 2.0 mole, the methylol group-introducing reaction proceeds too rapidly, and hence, the reaction is impracticable.

The basic catalyst to be used in the reaction of the formaldehyde and the composition (A), i.e. in the methylol group-introducing reaction includes a primary amine of the formula: R—$NH_2$ wherein R is a hydrocarbon group having 1 to 20 carbon atoms, which is used alone or as a mixture thereof with another basic catalyst. Suitable examples of the primary amine are an alkylamine having 1 to 20 carbon atoms in the alkyl moiety (e.g. methylamine, ethylamine, n-propylamine, isopropylamine, n-butylamine, isobutylamine, sec-butylamine, tert-butylamine, n-pentylamine, n-hexylamine, or n-octylamine), a cycloalkylamine having 6 to 15 carbon atoms (e.g. cyclohexylamine), an or aralkylamine having 7 to 15 carbon atoms (e.g. benzylamine, or phenethylamine). Examples of other basic catalysts are a dialkylamine having 1 to 20 carbon atoms in each alkyl moiety (e.g. dimethylamine, diethylamine, or dipropylamine), a trialkylamine having 1 to 20 carbon atoms in each alkyl moiety (e.g. trimethylamine, triethylamine), an alkylenediamine having 2 to 5 carbon atoms in the alkylene moiety (e.g. ethylenediamine, or propylenediamine), trimethylolamine, hexamethylenetetramine, or the like; and hydroxides, such as an alkali metal hydroxide or alkaline earth metal hydroxide (e.g. sodium hydroxide, potassium hydroxide, or barium hydroxide).

In order to obtain a uniform and stable varnish which is prepared from the resin composition of the present invention and a solvent as described hereinafter, the primary amine of the formula: R—NH$_2$ as mentioned above is preferably used alone or in a combination with other basic compounds.

The amount of the basic catalyst is not critical, but it is preferably used in an amount of 0.01 to 0.5 mole per 1 mole of the phenol used for the preparation of the composition (A), i.e. the phenol contained in the composition (A) in the form of unreacted phenol and of adduct. When the primary amine of the formula: R—NH$_2$ is used in an amount of less than 0.01 mole per 1 mole of the starting phenol, the phenol resin modified with a liquid polybutadiene can not give the desired homogeneous and stable varnish, and on the other hand, when the amount of the primary amine is over 0.5 mole, the methylol group-introducing reaction proceeds too rapidly, and hence, the reaction is impracticable.

Moreover, when the resin composition of the present invention is used for the preparation of a laminated sheet having high electrical insulation properties, the primary amine is used together with ammonia or other amine compounds as mentioned above, wherein the primary amine is used in an amount of not less than 0.01 mole and the total amount of the basic catalyst is up to 0.5 mole.

The other reaction conditions for the methylol group-introducing reaction are not critical, either, but the reaction is preferably carried out at a temperature of 60° to 120° C. for 30 to 300 minutes, more preferably for 60 to 180 minutes. The reaction product may be used as a varnish for the preparation of a laminated sheet as it is, or after being dehydrated under reduced pressure and then being diluted with an appropriate solvent.

The methylol group-introducing reaction is preferably carried out in an appropriate solvent. The solvent includes hydrocarbons, halogenated hydrocarbons, alcohols, ethers, ketones, esters, or the like. Suitable examples of the hydrocarbons are benzene, toluene, xylene, durene, hexane, heptane, pentane, octane, or the like. Among them, benzene, toluene and xylene are particularly preferable. Suitable examples of the halogenated hydrocarbons are monochlorobenzene, monobromobenzene, dichlorobenzene, dichloroethane, perchloroethylene, chlorohexane, chlorooctane, or the like. The alcohols employed are preferably alcohols having 1 to 27 carbon atoms, for example, saturated monovalent alcohols such as methyl alcohol, ethyl alcohol, n-propyl alcohol, isopropyl alcohol, n-butyl alcohol, isobutyl alcohol, sec-butyl alcohol, tert-butyl alcohol, n-amyl alcohol, sec-amyl alcohol, 1-ethylpropyl alcohol, isoamyl alcohol, tert-amyl alcohol, 2,2-dimethylpropyl alcohol, 1,2-dimethylpropyl alcohol, n-hexyl alcohol, 1,3-dimethyl-n-butyl alcohol, 1-methyl-n-hexyl alcohol, n-heptyl alcohol, 1-methyl-n-heptyl alcohol, n-octyl alcohol, capryl alcohol, 2-ethyl-n-hexyl alcohol, isooctyl alcohol, n-nonyl alcohol, n-decyl alcohol, n-undecyl alcohol, n-dodecyl alcohol, n-tridecyl alcohol, n-tetradecyl alcohol, n-pentadecyl alcohol, cetyl alcohol, stearyl alcohol, n-nonadecyl alcohol, behenyl alcohol, cyclohexanol, or the like; unsaturated monovalent alcohols such as allyl alcohol, propargyl alcohol, crotyl alcohol, oleyl alcohol, elaidyl alcohol, linoleyl alcohol, geraniol, or the like; aromatic alcohols such as benzyl alcohol, β-phenylethyl alcohol, hydrocinnamyl alcohol, or the like; ether alcohols such as ethylene glycol monomethyl ether, ethylene glycol monoethyl ether, ethylene glycol monoisopropyl ether, ethylene glycol monobutyl ether, diethylene glycol monomethyl ether, diethylene glycol monoethyl ether, triethylene glycol monomethyl ether, furfuryl alcohol, tetrahydrofurfuryl alcohol, or the like, which may be used alone or in a combination of two or more thereof. Although divalent alcohols such as ethylene glycol, diethylene glycol, propylene glycol, propanediol and butanediol may also be used, it is preferable to use an alcohol having a lower molecular weight because of the ease of the removal thereof during the drying step of the varnish.

Suitable examples of ethers are dimethyl ether, diethyl ether, dipropyl ether, tetrahydrofuran, or the like. Suitable examples of ketones are acetone, diethyl ketone, dipropyl ketone, cyclohexanone, or the like. Suitable examples of esters are ethyl formate, ethyl acetate, isoamyl acetate, ethyl butyrate, or the like.

A particularly preferred solvent is a mixture of 1 part by weight of a hydrocarbon as mentioned above and 0 to 100 parts by weight, more preferably 0 to 5 parts by weight, of an alcohol as mentioned above.

The amount of the solvent is not critical, but it is usually used in an amount of 1 to 2,000 parts by weight, preferably 20 to 500 parts by weight, per 100 parts by weight of the composition (A).

The present resin composition comprising a phenol resin modified with a liquid polybutadiene can be used for the production of laminated sheets by conventional methods. For example, the resin composition is firstly dissolved in an appropriate solvent to obtain a varnish, and the varnish thus prepared is impregnated into a base material and then dried to obtain a prepreg. Alternatively, the prepreg may be obtained by previously impregnating a prescribed amount of a water-soluble phenol resin and/or a phenol resin modified with an amine into a base material, drying the base material, and thereafter impregnating a prescribed amount of the resin composition of the present invention into the base material thus obtained, followed by drying. A necessary number of the prepreg thus prepared are piled up and pressed with heating to give the desired laminated sheet.

The solvent used for the preparation of a varnish includes the same solvents as used in the methylol group-introducing reaction as mentioned above, such as hydrocarbons, alcohols, ethers, ketones, and esters. Among them, toluene, methanol and acetone are preferable from the practical and economical viewpoints.

The base material used for the laminated sheet includes paper, cotton cloth, asbestos paper, asbestos cloth, glass fiber cloth, or the like. The base material is preferably subjected to a conventional surface treatment in order to improve the adhesion with the phenol resin modified with a liquid polybutadiene. For example, the glass fiber cloth containing no alkali is previously treated with silane or borane. When a plurality of the prepregs are piled up and a copper foil is piled thereon, and then the resulting piled product is heat-pressed, there can be obtained a copper-clad laminate.

The present invention is illustrated by the following Examples, but is not limited thereto.

EXAMPLE 1

A mixture of phenol (780 g), toluene (260 g) and boron trifluoride-phenol complex (2.6 ml) was heated at 70° C. and thereto was added in portions with agitation a liquid polybutadiene (520 g), which had a viscosity of 230 cps at 20° C., a number average molecular weight of 1110 (measured by a vapor pressure osmometer), a cis-1,4 structure of 71%, a trans-1,4 structure of 26% and a vinyl structure of 3%, over a period of 30 minutes, and the mixture was reacted with agitation at 80° C. for 100 minutes, and thereto was added triethylamine (3.0 ml) in order to stop the reaction to give a resin composition ($A_1$).

It was analytically confirmed that the resin composition ($A_1$) was a mixture of a liquid polybutadiene-phenol adduct and unreacted phenol, and in the adduct, 4.8 molecules of phenol on the average being added to one molecule of liquid polybutadiene (i.e. one molecule of phenol per 4.3 butadiene units).

The resin composition ($A_1$) (1000 g) was mixed with paraformaldehyde (207 g), n-butylamine (78 g), toluene (377 g) and isopropyl alcohol (135 g), and the mixture was reacted with agitation at 80°-85° C. for 3 hours (It was analytically confirmed that unreacted phenol was contained in the reaction mixture in an amount of less than 30% by weight based on the total phenol used for the preparation of the resin composition). After the reaction, the reaction mixture was concentrated under reduced pressure and the concentrated mixture was dissolved in a mixed solvent of toluene-methanol (2:1 by weight) to give a varnish of a phenol resin modified with a liquid polybutadiene which contained 55% by weight of non-volatile components.

By using the varnish thus obtained, a copper-clad laminate was prepared in the following manner. That is, a cotton linter paper, which was previously under-coated with a water-soluble phenol resin varnish, was impregnated with the varnish obtained above and dried to give a prepreg (impregnated resin content: 52% by weight).

Eight sheets of the prepreg thus obtained were piled up and on the most outer sheet was piled a copper foil with an adhesive and the piled product was heat-pressed at 160° C. under a pressure of 80-100 kg/cm² for 50 minutes to give a copper-clad laminate having a thickness of 1.6 mm.

EXAMPLE 2

The resin composition ($A_1$) (1000 g) obtained in Example 1 was mixed with paraformaldehyde (207 g), hexamethylenetetramine (30 g), n-butylamine (19.5 g), toluene (377 g) and isopropyl alcohol (135 g), and the mixture was reacted with agitation at 80°-85° C. for 3 hours in a reactor (It was analytically confirmed that unreacted phenol was contained in the reaction mixture in an amount of less than 30% by weight based on the total phenol used for the preparation of the resin composition). The reaction mixture was concentrated under reduced pressure and the concentrated mixture was dissolved in a mixed solvent of toluene-methanol (2:1 by weight) to give a varnish of the phenol resin modified with liquid polybutadiene which contained 55% by weight of non-volatile components.

By using the varnish thus obtained, a copper-clad laminate was prepared in the following manner. That is, a cotton linter paper, which was previously under-coated with a water-soluble phenol resin varnish, was impregnated with the varnish obtained above and dried to give a prepreg (impregnated resin content: 55% by weight).

Eight sheets of the prepreg thus obtained were piled up and on the most outer sheet was piled a copper foil with an adhesive and the piled product was heat-pressed at 160° C. under a pressure of 80-100 kg/cm² for 50 minutes to give a copper-clad laminate having a thickness of 1.6 mm.

EXAMPLE 3

The resin composition ($A_1$) (1000 g) obtained in Example 1 was mixed with paraformaldehyde (160 g), hexamethylenetetramine n-butylamine (39 g), toluene (377 g) and isopropyl alcohol (135 g), and the mixture was reacted with agitation at 80°-85° C. for 3 hours in a reactor (It was analytically confirmed that unreacted phenol was contained in the reaction mixture in an amount of less than 30% by weight based on the total phenol used for the preparation of the resin composition). The reaction mixture was concentrated under reduced pressure and the concentrated mixture was dissolved in a mixed solvent of toluene-methanol (2:1 by weight) to give a varnish of a phenol resin modified with liquid polybutadiene which contained 55% by weight of nonvolatile components.

By using the varnish thus obtained, a copper-clad laminate was prepared in the following manner. That is, a cotton linter paper, which was previously under-coated with a water-soluble phenol resin varnish, was impregnated with the varnish obtained above and dried to give a prepreg (impregnated resin content: 53% by weight).

Eight sheets of the prepreg thus obtained were piled up and on the most outer sheet was piled a copper foil with an adhesive, and the piled product was heat-pressed at 160° C. under a pressure of 80-100 kg/cm² for 50 minutes to give a copper-clad laminate having a thickness of 1.6 mm.

EXAMPLE 4

The same liquid polybutadiene (480 g) as used in Example 1 was added in portions with agitation at 70° C. to a mixture of phenol (530 g), toluene (240 g), and boron trifluoride-phenol complex (2.4 ml) over a period of 30 minutes, and the mixture was reacted with agitation at 70° C. for 80 minutes, and thereto was added triethylamine (3.0 ml) in order to stop the reaction to give a resin composition ($A_2$).

It was analytically confirmed that the resin composition ($A_2$) was a mixture of a liquid polybutadiene-phenol adduct and unreacted phenol, and in the adduct, 4.6 molecules of phenol on the average being added to one molecule of liquid polybutadiene (i.e. one molecule of phenol per 4.5 butadiene units).

The resin composition ($A_2$) (1000 g) thus obtained was mixed with paraformaldehyde (135 g), hexamethylenetetramine (12.5 g), n-butylamine (33 g), toluene (323 g) and isopropyl alcohol (129 g), and the mixture was reacted with agitation at 80°-85° C. for 3 hours in a reactor (It was analytically confirmed that unreacted phenol was contained in the reaction mixture in an amount of less than 30% by weight based on the total phenol used for the resin composition). The reaction mixture was concentrated under reduced pressure and the concentrated mixture was dissolved in a mixed solvent of toluene-methanol (3:1 by weight) to give a varnish of phenol resin modified with liquid polybutadiene which contained 55% by weight of non-volatile components.

By using the varnish thus obtained, a copper-clad laminate was prepared in the following manner. That is, a cotton linter paper, which was previously undercoated with a water-soluble resin varnish, was impregnated with the varnish obtained above and dried to give a prepreg (impregnated resin content: 53% by weight).

Eight sheets of the prepreg thus obtained were piled up and on the most outer sheet was piled a copper foil with an adhesive, and the piled product was heat-pressed at 160° C. under a pressure of 80–100 kg/cm² for 50 minutes to give a copper-clad laminate having a thickness of 1.6 mm.

EXAMPLE 5

The same liquid polybutadiene (520 g) as used in Example 1 was mixed with phenol (780 g) and p-toluenesulfonic acid (3.9 g), and the mixture was reacted with agitation at 120° C. for 2 hours and thereto was added triethylamine (2.0 ml) in order to stop the reaction to give a resin composition $(A_3)$.

It was analytically confirmed that in a liquid polybutadiene-phenol adduct contained in the resin composition $(A_3)$, 4.3 molecules of phenol were added to one molecule of liquid polybutadiene (i.e. one molecule of phenol per 4.8 butadiene units).

The resin composition $(A_3)$ was reacted with formaldehyde in the same manner as described in Example 1, and the reaction mixture was concentrated under reduced pressure and the concentrated mixture was dissolved in a mixed solvent of toluene-methanol (3:1 by weight) to give a varnish of a phenol resin modified with a liquid polybutadiene which contained 55% by weight of non-volatile components.

By using the varnish thus obtained, a copper-clad laminate was prepared in the following manner. That is, a cotton linter paper, which was previously undercoated with a water-soluble phenol resin varnish, was impregnated with the varnish obtained above and dried to give a prepreg (impregnated resin content: 55% by weight).

Eight sheets of the prepreg thus obtained were piled up and on the most outer sheet was piled a copper foil with an adhesive, and the piled product was heat-pressed at 160° C. under a pressure of 80–100 kg/cm² for 50 minutes to give a copper-clad laminate having a thickness of 1.6 mm.

REFERENCE EXAMPLES 1 to 5

The resin composition $(A_1)$ (1000 g) obtained in Example 1 was mixed with paraformaldehyde (207 g), toluene (377 g), isopropyl alcohol (135 g) and each catalyst as shown in Table 1 in an amount as shown in the Table, and the mixture was reacted with agitation at 80°–85° C. in a reactor until the unreacted phenol became 30% by weight based on the total phenol used for the preparation of the resin composition. After the reaction, the reaction mixture was concentrated under reduced pressure and the concentrated mixture was dissolved in toluene, or a mixed solvent of toluene-methanol or of toluene-methanol-acetone in order to prepare a varnish. However, in Reference Examples 2 and 5, the mixture was not dissolved in the solvent. In Reference Examples 1, 3 and 4, the mixture was dissolved in a mixed solvent of toluene-methanol (3:1 by weight) and there could be obtained a varnish of a phenol resin modified with liquid polybutadiene which contained 55% by weight of non-volatile components.

TABLE 1

| Example No. | Kind of catalyst | Amount of catalyst |
| --- | --- | --- |
| Reference Example 1 | Hexamethylenetetramine | 30 g (0.04 M)* |
| Reference Example 2 | Triethylamine | 107 g (0.2 M) |
| Reference Example 3 | Di-n-butylamine | 165 g (0.2 M) |
| Reference Example 4 | Hexamethylenetetramine | 30 g (0.04 M) |
| Example 4 | n-butylamine | 1.9 g (0.005 M) |
| Reference Example 5 | Hexamethylenetetramine | 15 g (0.02 M) |
| | Triethylamine | 53.5 g (0.1 M) |

[Remark]:
*The number shown in parenthesis means the molar number of the catalyst per 1 mole of the phenol contained in the composition.

REFERENCE EXAMPLE 6

The same liquid polybutadiene (520 g) as used in Example 1 was added in portions with agitation at 70° C. to a mixture of phenol (780 g), toluene (260 g) and boron trifluoride-phenol complex (2.6 ml) over a period of 30 minutes and the mixture was reacted with agitation at 70° C. for 20 minutes and to the reaction mixture was added triethylamine (3.0 ml) in order to stop the reaction to give a resin composition $(A_4)$.

It was analytically confirmed that in a liquid polybutadiene-phenol adduct contained in the resin composition $(A_4)$, 2.1 molecules of phenol were added to one molecule of the liquid polybutadiene (i.e. one molecule of phenol per 10 butadiene units).

In the same manner as described in Example 1, a varnish of a phenol resin modified with a liquid polybutadiene was prepared by using the resin composition $(A_4)$ obtained above.

REFERENCE EXAMPLE 7

The same liquid polybutadiene (520 g) as used in Example 1 was added in portions with agitation at 70° C. to a mixture of phenol (780 g), toluene (260 g) and boron trifluoride-phenol complex (5.2 ml) over a period of 30 minutes, and the mixture was reacted with agitation at 95° C. for 180 minutes, and to the reaction mixture was added triethylamine (6.0 ml) in order to stop the reaction to give a resin composition $(A_5)$.

It was analytically confirmed that in the liquid polybutadiene-phenol adduct contained in the resin composition $(A_5)$, 8.2 molecules of phenol were added to one molecule of the liquid polybutadiene (i.e. one molecule of phenol per 2.5 butadiene units).

In the same manner as described in Example 1, a varnish of a phenol resin modified with a liquid polybutadiene was prepared by using the resin composition $(A_5)$ obtained above, and further a copper-clad laminate was prepared by using the varnish thus obtained.

The properties of the varnishes and copper-clad laminates obtained in the above Examples 1 to 5 and Reference Examples 1 to 7 are shown in the following Tables 2 and 3. The properties of the copper-clad laminates were measured as follows:

(1) Dielectric dissipation factor, dielectric constant, water absorption, trichlene resistance and flexural strength . . . in accordance with the provision of JIS C-6481.

(2) Punchability . . . in accordance with the provision of ASTM D-617-70.

TABLE 2

| Example No. | Stability of*[1] varnish | Gelling time*[2] | Curing*[3] characteristics |
|---|---|---|---|
| Example 1 | Not changed for more than 21 days | 5 minutes | Uniformly cured |
| Example 2 | Not changed for more than 21 days | 5 minutes | Uniformly cured |
| Example 3 | Not changed for more than 21 days | 5 minutes | Uniformly cured |
| Example 4 | Not changed for more than 21 days | 6 minutes | Uniformly cured |
| Example 5 | Not changed for more than 14 days | 6 minutes | Uniformly cured |
| Reference Example 1 | White precipitates after 3 days | 8 minutes | Uniformly cured |
| Reference Example 2 | Not dissolved uniformly | 5 minutes | Uniformly cured |
| Reference Example 3 | Not changed for more than 21 days | more than 15 minutes | Unevenly cured (non-cured portions were observed) |
| Reference Example 4 | White precipitates after 3 days | 8 minutes | Uniformly cured |
| Reference Example 5 | Not dissolved uniformly | 7 minutes | Uniformly cured |
| Reference Example 6 | Separated into two layers after 2 days | more than 15 minutes | Unevenly cured (non-cured portions were observed) |
| Reference Example 7 | Not changed for more than 21 days | Shorter than 3 minutes | Uniformly cured |

[Remarks]:
*[1] The varnishes (non-volatile components: 55% by weight) were allowed to stand at 15-20° C., and the appearance thereof was observed.
*[2] Time till the varnishes were gelled when heated on a hot plate at 150° C.
*[3] The varnishes were cured by heating at 160° C. for 20 minutes and then the appearence thereof was observed.

TABLE 2

| Properties | | Example 1 | Example 2 | Example 3 | Example 4 | Example 5 | Reference Example 7 |
|---|---|---|---|---|---|---|---|
| Dielectric dissipation factor (1 MHZ) | C-90/20/65 | 0.0322 | 0.0344 | 0.0342 | 0.0290 | 0.0356 | 0.0342 |
| | C-90/20/65 + D-48/50 | 0.0463 | 0.0482 | 0.518 | 0.0478 | 0.0533 | 0.0855 |
| Dielectric constant (1 MHZ) | C-90/20/65 | 4.450 | 4.605 | 4.562 | 4.030 | 4.841 | 4.505 |
| | C-90/20/65 + D-48/50 | 5.040 | 5.274 | 5.214 | 4.674 | 5.601 | 6.122 |
| Water absorption | E-24/50 + D-24/23 | 0.43% | 0.41% | 0.48% | 0.43% | 0.47% | 1.1% |
| Trichlene resistance | Boiled for 5 minutes | Not changed | Not changed | Not changed | Not changed | Not changed | Not changed |
| Flexural strength (in horizontal direction) | (kg/mm$^2$) | 15.6 | 15.7 | 15.2 | 13.0 | 15.0 | 10.0 |
| Punchability (at 50-70° C.) | ASTM D-617-70 | Very good | Very good | Very good | Excellent | Very good | bad |

What is claimed is:

1. A process for the preparation of a phenol resin modified with a liquid polybutadiene, which comprises reacting a polybutadiene having a number average moleuclar weight of 150 to 5,000 with a phenol in the presence of an acid catalyst to obtain a composition of a polybutadiene-phenol adduct wherein one molecule of phenol per 3 to 8 butadiene units is added to the polybutadiene, and reacting the composition of the polybutadiene-phenol adduct with a formaldehyde in the presence of a basic catalyst, said basic catalyst comprising a primary amine of the formula: $R-NH_2$ wherein R is a hydrocarbon group having 1 to 20 carbon atoms in an amount of 0.01 to 0.5 mole per 1 mole of the phenol used for the preparation of the composition.

2. A process according to claim 1, wherein the basic catalyst comprises the primary amine of the formula: $R-NH_2$ and at least one other basic compound of up to 0.5 mole per 1 mole of the phenol used for the preparation of the composition.

3. A process according to claim 1, wherein the primary amine is a member selected from the group consisting of methylamine, ethylamine, n-propylamine, isopropylamine, n-butylamine, isobutylamine, sec-butylamine, tert-butylamine, n-pentylamine, n-hexylamine, cyclohexylamine and n-octylamine.

4. A process according to claim 2, wherein the other basic compound is a member selected from the group consisting of ammonia, dimethylamine, diethylamine, dibutylamine, hexamethylenetetramine, trimethylamine, trimethanolamine, and triethanolamine.

5. A process according to claim 1, wherein the formaldehyde is used in an amount of 0.6 to 2.0 mole per 1 mole of the phenol used for the preparation of the composition.

6. A process according to claim 1, wherein the liquid polybutadiene has a 1,4-structure of at least 80%.

7. A process according to claim 1, wherein the phenol is used in an amount of 10 to 1,000 parts by weight to 100 parts by weight of the liquid polybutadiene.

8. A process according to claim 7, wherein the amount of phenol is in the range of 50 to 400 parts by weight.

9. A process according to claim 1, wherein the reaction of the liquid polybutadiene and the phenol is carried out in the presence of a solvent selected from the group consisting of a hydrocarbon and a halogenated hydrocarbon which has a dielectric constant of not higher than 15° at 25° C.

* * * * *